United States Patent [19]

Nakamura et al.

[11] Patent Number: 5,087,551
[45] Date of Patent: Feb. 11, 1992

[54] PROCESS FOR PREPARING OF SEMICONDUCTOR DEVICE AND PATTERN-FORMING COATING SOLUTION USED FOR THIS PROCESS

[75] Inventors: Yuko Nakamura, Kawasaki; Satoshi Takechi, Machida, both of Japan

[73] Assignee: Fujitsu Limited, Kanagawa, Japan

[21] Appl. No.: 487,089

[22] Filed: Mar. 2, 1990

[30] Foreign Application Priority Data

Mar. 3, 1989 [JP] Japan .................................. 1-050157

[51] Int. Cl.$^5$ ........................... G03C 1/72; G03F 7/10
[52] U.S. Cl. .................................. 430/270; 430/296; 430/326
[58] Field of Search ................. 430/270, 296, 326

[56] References Cited

U.S. PATENT DOCUMENTS 4,535,054  8/1955  Brault et al. ...................... 430/325

FOREIGN PATENT DOCUMENTS 63-137227  6/1988  Japan .

OTHER PUBLICATIONS

IBM Technical Disclosure Bulletin, vol. 23, No. 33, Aug. 1980, New York U.S. p. 991 Moreau V. M. & Moyer W. A.: "Coating Solvent for Resist Film" *the whole document*.

*Primary Examiner*—Richard L. Schilling
*Assistant Examiner*—Janet C. Baxter
*Attorney, Agent, or Firm*—Armstrong, Nikaido, Marmelstein, Kubovcik & Murray

[57] ABSTRACT

A process for the preparation of a semiconductor device and a pattern-forming coating solution used for this process are disclosed. In this process, a coating solution formed by dissolving an α-methylstyrene/methyl α-chloroacrylate copolymer as a specific positive resist material in a specific solvent is coated on a layer to be etched, which is formed on a semiconductor substrate. In this process, penetration between the substrate and the resist of the resist into the clayer to be etched, and a formation of cracks in the resist after the etching, are prevented.

5 Claims, 4 Drawing Sheets

PROCESS FOR PREPARING OF SEMICONDUCTOR DEVICE AND PATTERN-FORMING COATING SOLUTION USED FOR THIS PROCESS

BACKGROUND OF THE INVENTION (1) Field of the Invention

The present invention relates to a process for the preparation of a semiconductor device, and a pattern-forming coating solution. More particularly, the present invention relates to a process for the preparation of a semiconductor device in which a formation of cracks during electron beam (EB) lithography can be prevented, and a pattern-forming coating solution used for carrying out this process.

(2) Description of the Related Art

In the production of semiconductor devices, demands in the microelectronic industry for large scale integrated circuits place ever-increasing demands on lithography to reduce the size of electronic compounds and increase the resolution. A lithographic technique using short waves such as electron, beams and X-rays can be mentioned as one means satisfying this requirement, and the resist material used for this lithographic technique is a factors having an influence on the precision. The resist material must have not only a high sensitivity and resolution but also a good resistance to plasma etching, because the high resolution lithography will require dry etching techniques such as plasma etching.

The inventors have developed a positive resist material having a high resolution and a high dry etching resistance, which comprises a novel α-methylstyrene/methyl α-chloroacrylate copolymer represented by the following formula (Japanese Unexamined Patent Publication No. 63-137227):

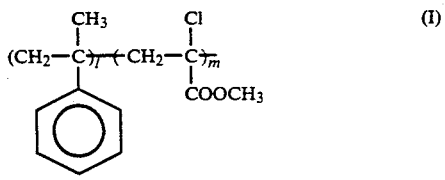

wherein l is a number of at least 3 and m is a number smaller than 7, with the proviso that the sum of l and m is 10 and Mw is at least 20,000.

The resist composed of this novel copolymer is a positive resist of high resolution and high contrast. As is seen from the above-mentioned unexamined patent publication, this resist has a very high sensitivity and an excellent resistance to dry etching, in combination.

Nevertheless, if this resist material is coated by using a coating solvent such as monochlorobenzene, as shown in FIGS. 1A through 1E and FIGS. 2A and 2B, a formation of cracks (FIG. 2A) and penetration of developer on etch species between the resist and the substrate (FIG. 2B) often occur after development or etching.

The mechanism of the occurrence of such problems will now be diagrammatically described. An insulating film 2 (for example, PSG) is formed on a semiconductor substrate 1 (FIG. 1A), and a resist material composed of the above-mentioned α-methylstyrene/methyl α-chloroacrylate copolymer is coated on the insulating film to form a resist layer 3 (FIG. 1B). Then, after pre-baking, an E.B. exposure is carried out (FIG. 1C), and after the exposure, the development is carried out with xylene (FIG. 1D). By using the resist pattern formed by the development, etching (isotropic etching or anisotropic etching) is carried out to obtain a desired pattern (FIG. 1E).

As shown in FIGS. 2A and 2B (each being an enlarged view of FIG. 1E), the formation of a "crack A" is observed in the resist layer, and furthermore, a "penetration B" of developer or etch species occurs between the insulating layer 2 and the resist 3.

When the lithographic technique using the above-mentioned resist is applied to the processing of forming contact holes, if the contact holes are formed close to one another, it is feared that the above-mentioned cracking or penetration will result in a leakage among elements, and the product characteristics will be lowered.

SUMMARY OF THE INVENTION

A primary object of the present invention is to provide a process for the preparation of a semiconductor device, in which the occurrence of "cracking" or "penetration" after development or etching is prevented when an α-methyl-styrene/methyl α-chloroacryate copolymer is coated from a predetermined solvent such as bromobenzene or benzonitrile on a layer to be etched (film to be processed).

Another object of the present invention is to provide a pattern-forming coating solution which does not cause "cracking" or "penetration" at the litographic step in the process for the preparation of a semiconductor device.

In the present invention, by the term "cracking" is meant a formation of tears or cracks from a part of the resist pattern (window) formed as the etching mask, and by the term "penetration" is meant the phenomenon in which the developer is allowed to penetrate the interface between the resist and the substrate after the development because of an insufficient adhesion between the resist and the substrate, and the resist is peeled from the substrate, or the phenomenon in which the etching agent is allowed to penetrate the interface between the resist and the substrate at the isotropic etching because of an insufficient adhesion between the resist and the substrate after the etching, and the etching quantity in the lateral direction is much larger than the etching quantity in the longitudinal direction.

BRIEF DESCRIPTION OF THE DRAWINGS

These objects and advantages of the present invention will be made clear by the following description of a preferred embodiment of the present invention with reference to the accompanying drawings, wherein.

DESCRIPTION OF THE PREFERRED EMBODIMENT

Figure 1A:
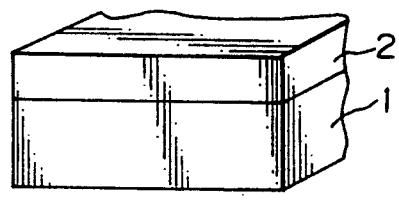
FIGS. 1A through 1E are perspective views illustrating the outline of the steps of preparing a semiconductor device according to the conventional technique.
Figure 1B:
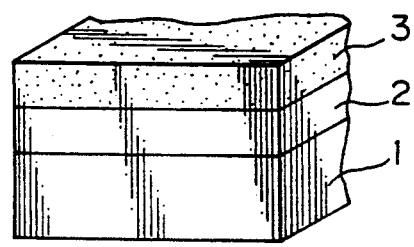
Figure 1C:
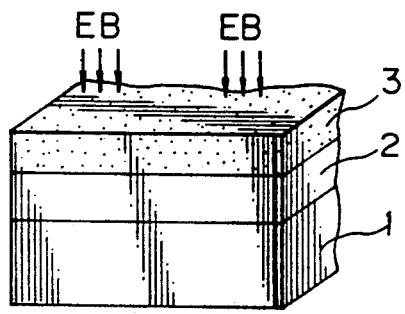
Figure 1D:
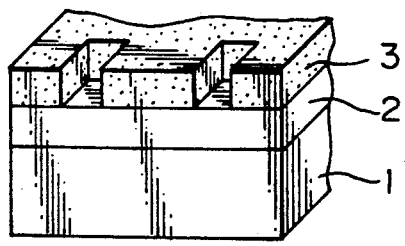
Figure 1E:
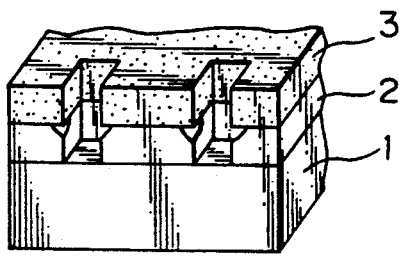
Figure 2A:
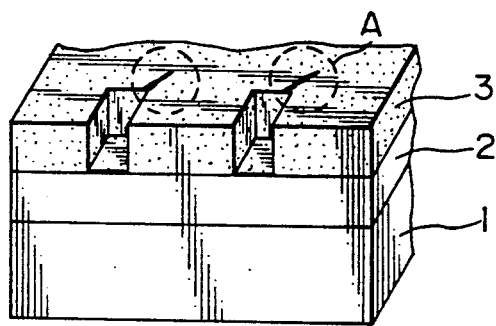
FIGS. 2A and 2B are enlarged perspective views corresponding to FIG. 1E.
Figure 2B:
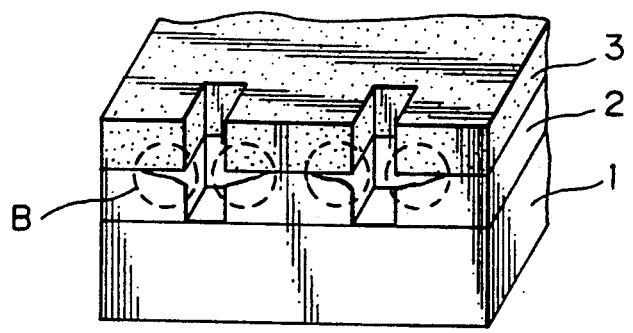

The inventors investigated the foregoing problems, and as a result, found that the developing property, the probability of formation of cracks after the development or etching, and the probability of penetration between a substrate and the resist after the development or etching depend greatly on the kind of coating solvent. The inventors then experimented with various coating solvents, and as a result, found that o-dichlorobenzene, ethyl benzoate, bromobenzene, benzonitrile and nitrobenzene very effectively prevent the above-mentioned cracking and penetration. The present invention is based on this finding.

Furthermore, it was found that, if o-dichlorobenzene and ethyl benzoate are selected from among the above-mentioned coating solvents and coating solutions containing them are coated on a layer to be etched, followed by development and E.B. exposure, a formation of cracks and penetration is very effectively prevented, as described hereinafter.

More specifically, in accordance with the present invention, there is provided a process for the preparation of a semiconductor device, which comprises the steps of (a) forming a resist layer by coating a coating solution of a positive resist material composed of an α-methylstyrene/methyl α-chloroacrylate copolymer in at least one solvent selected from the group consisting of bromobenzene, benzonitrile, o-dichlorobenzene, ethyl benzoate and nitrobenzene on a substrate or on an a layer to be etched and formed on a substrate, (b) subjecting the resist layer formed at step (a) to electron beam (E.B.) exposure, (c) developing the exposed resist layer, and (d) etching the substrate or the layer to be etched, by using the resist pattern layer obtained by the development as a mask.

Furthermore, in accordance with the present invention, there is provided a pattern-forming coating solution for use in carrying out the above-mentioned process for the preparation of a semiconductor device, which comprises a positive resist material composed of an α-methylstyrene/methyl α-chloroacrylate copolymer which is dissolved in at least one solvent selected from the group consisting of bromobenzene, benzonitrile, o-dichloro-benzene, ethyl benzoate and nitrobenzene.

As is seen from the foregoing description, the gist of the present invention is that a specific positive resist material is dissolved in a specific solvent and the formed solution is used as a pattern-forming coating solution in the production of a semiconductor device. Among specific solvents that can be used in the present invention, o-dichlorobenzene and ethyl benzoate provide coating solutions which provide excellent effects (patterning exposure dose range film thickness dependency) over coating solutions formed by using other solvents.

Note, the layer to be etched includes all layers to be etched in the production of a semiconductor device, for example, an insulating film (PSG or the like).

Namely, the present invention can be applied when the insulating crystal substrate such as the silicone substrate, the compound semiconductor semiconductor substrate, and Al$_2$O$_3$ substrate and the like is etched.

The present invention will now be described in detail with reference to the following examples, that by no means limit the scope of the invention.

EXAMPLE 1

Synthesis of α-methylstyrene/methyl α-chloroacrylate copolymer

An α-methylstyrene/methyl α-chloroacrylate was synthesized according to the following conditions.

Polymerization initiator, azobis-isobutyronitrile (AIBN): 0.12 mole %
Solvent, 1, 4-dioxane: 851.1 g
Monomer, α-methylstyrene: 2.8 moles
Monomer, methyl α-chloroacrylate: 1.2 moles
Reaction temperature: 80° C.
Reaction time (in nitrogen atmosphere): 25 hours The obtained copolymer was a copolymer of the above-mentioned formula (I), in which l was 5, m was 5 and the molecular weight was 30,000.

EXAMPLE 2

Figure 3A:
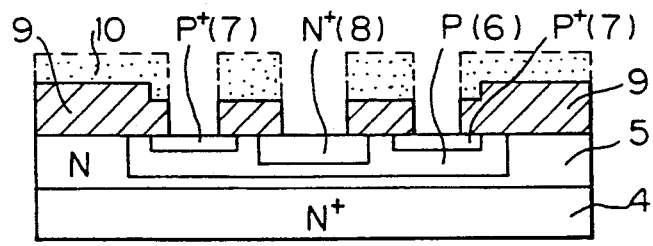
FIG. 3A through 3I are sectional views showing the steps of one embodiment of the process of the present invention.
Figure 3B:
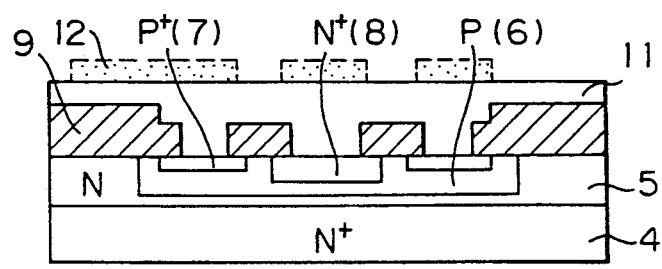
Figure 3C:
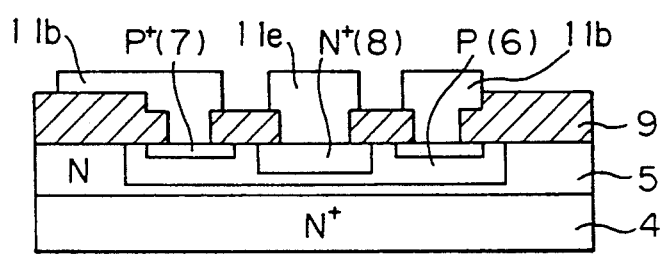
Figure 3D:
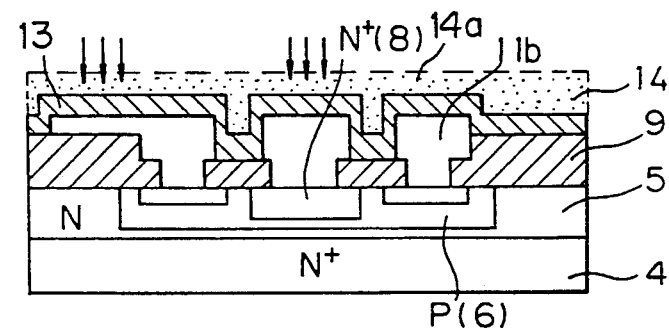
Figure 3E:
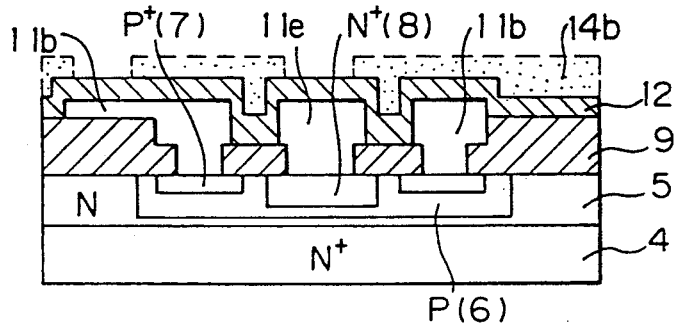
Figure 3F:
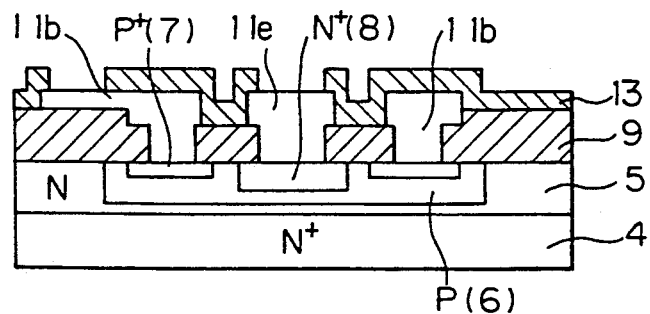

Coating solutions were prepared by using the copolymer obtained in Example 1 as the positive type resist material and bromobenzene, benzonitrile, o-dichlorobenzene, nitro-benzene or ethyl benzoate as the solvent. The coating solutions were used at the passivation step for a formation of contact hole, as shown in FIGS. 3D through 3F.

More specifically, an epitaxial layer 5 was formed on an N+ layer 4 as the collector, a P layer 6 was formed in the epitaxial layer 5, and a P+ layer 7 formed as the base region on both sides. Then an N+ layer 8 was formed as the emitter region, and thus the bulk-forming step was completed. Then a silicon oxide film 9 was formed on the bulk, a photoresist was coated on the silicon oxide film 9, and an electrode window opening operation for Al lines was carried out by a photolithographic technique (FIG. 3A).

Then Al 11a was deposited to a thickness of 8000 Å by the sputtering method (or the vacuum deposition method) (FIG. 3B), a base electrode 11b and a emitter electrode 11e were formed by using the photoresist 12 as a mask (FIG. 3C), and a PSG film 13 as the passivation film for the Al lines was deposited to a thickness of 10000 Å by the CVD method.

The above-mentioned coating solution was coated on the PSG film 13 as the passivation film to form a resist layer 14 having a thickness of 1.5 μm. Baking was carried out at 180° C. for 20 minutes, and E.B. exposure (20 kV) was carried out (FIG. 3D). The development was carried out with xylene to form a contact hole pattern 13b (FIG. 3E). The etching (isotropic etching and anisotropic etching) was carried out by using the obtained pattern as a mask, and the resist layer was removed to form contact holes for Al lines of the second layer (FIG. 3F).

Figure 3G:
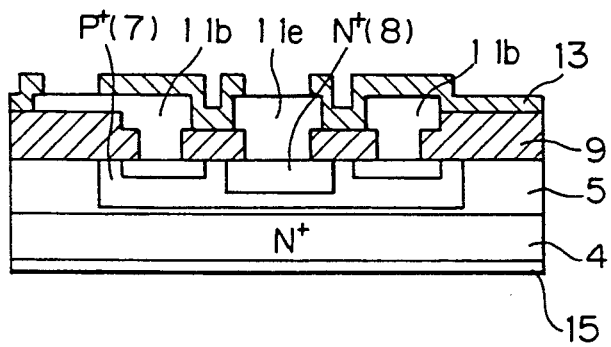
Figure 3H:
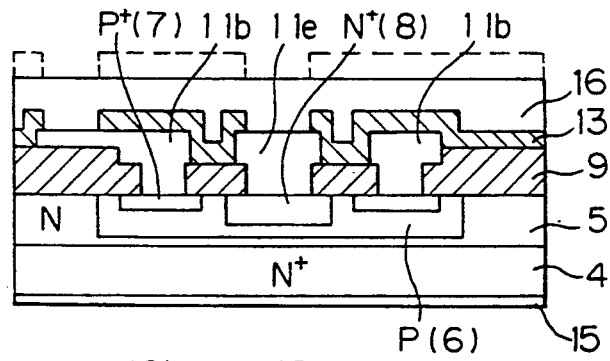
Figure 3I:
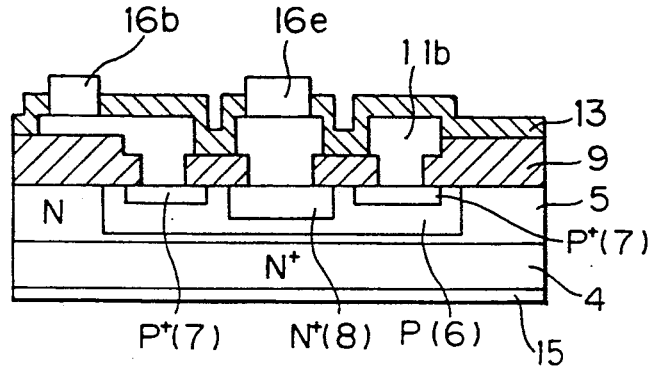

Then Au was vacuum-deposited on the back surface of the N+ layer 1 as the collector to form a collector electrode 15 (FIG. 3G). The above-mentioned steps were repeated to form a second aluminum layer 16 (FIG. 3H), and Al lines (16b, 16e) were formed, and thus the production of a semiconductor device was completed.

EXAMPLE 3 THROUGH 7 AND COMPARATIVE EXAMPLES 1 THROUGH 3

By using the casting solutions used in Example 2 and comparative coating solutions comprising a solvent other then the solvents of the present invention, the formation of contact holes and an etching treatment were carried out in the same manner as described in Example 2.

With respect to each of the obtained semiconductor devices, the formation of cracks and penetration between the substrate and resist of the processed film after the development and etching were checked by an optical microscope.

The results are shown in Table 1.

TABLE 1

| Example | Solvent | after Development cracking | after Development penetration | after Etching cracking | after Etching penetration | Remarks |
|---|---|---|---|---|---|---|
| Example 3 | bromobenzene | O | O | O | O | slightly wide taper after etching |
| Example 4 | benzonitrile | O | O | O | O | |
| Example 5 | o-dichlorobenzene | O | O | O | O | |
| Example 6 | ethyl benzoate | O | O | O | O | |
| Example 7 | nitrobenzene | O | O | O | O | |
| Comparative Example 1 | dimethyl cellosolve | X | X | X | X | |
| Comparative Example 2 | monochlorobenzene | X | O | X | O | contact holes were resolved |
| Comparative Example 3 | trichlorobenzene | X | O | X | O | slightly wide taper after etching |

Note
O: not observed
X: observed

The cracking and penetration between the substrate and the resist were evaluated by the following method.

A pattern comprising isolated holes of 20 $\mu m \times 5$ $\mu m$, 3.5 $\mu m \times 3.5$ $\mu m$, 28 $\mu m \times 12$ $\mu m$ and 5 $\mu m \times 20$ $\mu m$ and integrated holes of 1 $\mu m \times 1$ $\mu m$ was formed in one chip, and when "cracking" or "penetration" defined hereinbefore was observed under an optical microscope, it was judged that cracking or penetration had occurred (x in Table 1). When cracking or penetration was not observed under the optical microscope, it was judged that cracking or penetration had not occurred (o in Table 1).

EXAMPLE 8

With respect to each of the coating solvents used in the present invention, the dependency of the cracking or penetration between the substrate and the resist on the pattering exposure dose was determined.

The results are shown in Table 2.

TABLE 2

| Coating Solvent | Light Exposure Quantity ($\mu c/cm^2$) |
|---|---|
| bromobenzene | 53 to 58 |
| benzonitrile | 53 to 64 |
| o-dichlorobenzene | 50 to 64 |
| ethyl benzoate | 50 to 64 |
| nitrobenzene | 54 to 64 |

In Table 2, each value indicates the patterning exposure dose in the applicable region (cracking or penetration did not occur) with respect to each coating solvent.

As apparent from Table 2, o-dichlorobenzene and ethyl benzoate have a broader patterning exposure dose region (at least 50 $\mu c/cm^2$) than other solvents. This means that the process margin is large and the throughout is improved.

Note, if the light exposure dose exceeds the upper limit of the applicable exposure dose region, penetration readily occurs, and if the exposure dose is smaller than the lower limit, cracking is frequently observed.

With respect to each of the coating solvents of the present invention, the film thickness dependency was determined.

The results are shown in Table 3.

TABLE 3

| Coating Solvent | Applicable Film Thickness ($\mu m$) |
|---|---|
| bromobenzene | 0.5 to 1.5 |
| benzonitrile | 0.5 to 1.5 |
| o-dichlorobenzene | 0.5 to 1.65 |
| ethyl benzoate | 0.5 to 1.65 |
| nitrobenzene | 0.5 to 1.5 |

Table 3 indicates the applicable film thickness region of each coating solvent.

As seen from Table 3, o-dichlorobenzene and ethyl benzoate have a broader applicable film thickness region than other solvents. This means that, in these two coating solvents, the probability of cracking or penetration between the substrate and the resist is lower than in other coating solvents.

Note, in practical production, the film thickness must be at least 0.5 $\mu m$ and a film thickness of up to 1.7 $\mu m$ can be adopted. If the film thickness exceeds 1.7 $\mu m$, use of the film becomes difficult because the resolution power of the resist is lowered when the thickness is too large.

In the present invention, the concentration of the pattern-forming coating solution is 10 to 25% by weight (which corresponds to 300 to 900 parts by weight of the solvent per 100 parts by weight of the polymer). If the concentration is lower than 10% by weight, a desired uniform film thickness cannot be obtained. If the concentration is higher than 25% by weight, the viscosity is too high, the solution is not spread, and a uniform film cannot be obtained. Moreover, precipitation of the polymer sometimes occurs.

EXAMPLE 9

In the present example, a mixture of the solvents of the present invention was used.

A resist solution was prepared by dissolving the $\alpha$-methylstyrene-methyl $\alpha$-chloroacrylate copolymer having a molecular weight of 30,000, which was used in Examples 3 through 7, in a 2/1 mixed solvent of o-dichlorobenzene/ethyl benzoate. In the same manner as described in Example 2, the solution was coated in a thickness of 1.5 $\mu m$ on a PSG film, based at 180° C. for 20 minutes, subjected to E.B. light exposure (20 kV), and developed with xylene to form a contact hole pattern. After the formation of the contact hole pattern, etching was carried out.

As the result of observation under an optical microscope, it was found that cracking or penetration did not occur after the development or after the etching, and it was confirmed that even if a mixture of the solvents of the present invention is used, a strong effect of preventing cracking or penetration is similarly obtained.

As apparent from the foregoing description, according to the present invention, a coating solution is formed by using a specific solvent for a specific positive resist material, and a semiconductor device is prepared by conducting the resist-forming and etching steps by using this coating solution, whereby an effect of preventing both cracking and penetration after development and after etching a resist film having a thickness of 1.5 μm can be obtained. Therefore, the film thickness margin can be broadened and a good product yield can be obtained.

Pattern-forming coating solutions prepared by using o-dichlorobenzene and ethyl benzoate selected from the specific solvents of the present invention have an excellent patterning sensitivity dependency, compared with the coating solutions formed by using other solvents, and the applicable film thickness region is broadened and the probability of cracking or penetration between the substrate and the resist is much lower than when other solvents are used.

We claim:

1. A process for the preparation of a semiconductor device, which comprises steps of (a) forming a resist layer by coating a coating solution of a positive resist material composed of an α-methylstyrene/methyl α-chloroacrylate copolymer in at least one solvent selected from the group consisting of bromobenzene, benzonitrile, o-dichlorobenzene, ethyl benzoate and nitrobenzene on a substrate or on a layer to be etched formed on a substrate, (b) subjecting the resist layer formed at step (a) to electron beam (E.B.) exposure, (c) developing the exposed resist layer, and (d) etching the substrate or the layer to be etched, by using the resist pattern layer obtained by the development as a mask.

2. A process according to claim 1, wherein at the step (a), the coating solution of o-dichlorobenzene or ethyl benzoate is coated to a thickness of 0.5 to 1.65 μm.

3. A process according to claim 1, wherein at the step (b), a resist layer formed by coating the coating solution of o-dichlorobenzene or ethyl benzoate in a thickness of 0.5 to 1.65 μm is subjected to E.B. light exposure with an exposure dose of 50 to 64 μc/cm$^2$.

4. A pattern-forming coating solution for use in carrying out the process for the preparation of a semiconductor device, which comprises a positive resist material composed of an α-methylstyrene/methyl α-chloroacrylate copolymer, which is dissolved in at least one solvent selected from the group consisting of bromobenzene, benzonitrile, o-dichloro-benzene, ethyl benzoate and nitrobenzene.

5. A pattern-forming coating solution as set forth in claim 4, which is formed by dissolving 100 parts by weight of the α-methylstyrene/methyl α-chloroacrylate copolymer into 300 to 900 parts by weight of o-dichlorobenzene or ethyl benzoate.

* * * * *